US010750626B1

(12) United States Patent
Morales et al.

(10) Patent No.: US 10,750,626 B1
(45) Date of Patent: Aug. 18, 2020

(54) CONNECTOR ASSEMBLY AND METHOD

(71) Applicant: Lear Corporation, Southfield, MI (US)

(72) Inventors: Xavier Blas Morales, Valls (ES);
Ramón Piñana López, Valls (ES);
Joan Vila, Valls (ES); Joan Ignasi
Ferran Palau, Valls (ES); Angel
Molinero Benitez, Valls (ES); Jose
Gabriel Fernández Bañares, Valls
(ES)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 16/437,752

(22) Filed: Jun. 11, 2019

(51) Int. Cl.
H05K 7/02 (2006.01)
H05K 7/04 (2006.01)
H05K 5/00 (2006.01)
F16B 21/08 (2006.01)
H05K 5/03 (2006.01)

(52) U.S. Cl.
CPC .......... *H05K 5/006* (2013.01); *F16B 21/086* (2013.01); *H05K 5/03* (2013.01)

(58) Field of Classification Search
USPC ........................................................ 361/810
See application file for complete search history.

(56) References Cited

U.S. PATENT DOCUMENTS

| 3,533,045 A | 10/1970 | Henschen |
| 4,635,325 A * | 1/1987 | Yagi ...................... F16B 5/0607 174/138 D |
| 5,468,156 A | 11/1995 | Flinchbaugh et al. |
| 6,751,103 B1 * | 6/2004 | Sivertsen ............ H01M 2/1016 361/825 |
| 7,195,506 B1 | 3/2007 | Chang |
| 7,257,870 B2 | 8/2007 | Deas et al. |
| 7,760,491 B2 * | 7/2010 | Choi ........................ H04N 5/64 361/679.01 |
| 7,848,116 B2 | 12/2010 | Duppong et al. |
| 8,111,525 B2 | 2/2012 | Ong et al. |
| 9,054,410 B2 | 6/2015 | Maley |
| 9,333,367 B2 | 5/2016 | Chen |
| 2019/0257244 A1 * | 8/2019 | Hankwitz ............. F02B 63/044 |

FOREIGN PATENT DOCUMENTS

| EP | 1652414 B1 | 9/2007 |
| EP | 2741592 B1 | 9/2015 |

* cited by examiner

*Primary Examiner* — Hung S. Bui
(74) *Attorney, Agent, or Firm* — Fishman Stewart PLLC

(57) ABSTRACT

A connector assembly includes a connector, a circuit board, a housing. The connector may include a first portion, a second portion, and/or a third portion. The circuit board may include a first circuit board portion and/or a second circuit board portion. The connector may be configured to connect the first circuit board portion and/or the second circuit board portion to the housing. The first portion may be connected to the housing; the second portion may be connected to the first portion of the circuit board, and/or the third portion may be connected to the second portion of the circuit board. The first portion may include a first engagement portion, the second portion may include a second engagement portion, and/or the third portion may include a third engagement portion. The first engagement portion, the second engagement portion, and/or the third engagement portion may be disposed substantially perpendicular to each other.

19 Claims, 14 Drawing Sheets

CONNECTOR ASSEMBLY AND METHOD

TECHNICAL FIELD

The present disclosure generally relates to connectors and connector assemblies that may, for example, be used in connection with circuit boards and/or electrical assemblies.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical assemblies may be relatively complex to use and/or to assemble. Some electrical assemblies and/or connectors may not be configured for vertically connecting a circuit board to housing.

There is a desire for solutions/options that minimize or eliminate one or more challenges or shortcomings connectors. The foregoing discussion is intended only to illustrate examples of the present field and should not be taken as a disavowal of scope.

SUMMARY

The foregoing and other aspects, features, details, utilities, and/or advantages of embodiments of the present disclosure will be apparent from reading the following description, and from reviewing the accompanying drawings.

In embodiments, a connector assembly may include a connector, a circuit board, a housing. The connector may include a first portion, a second portion, and/or a third portion. The circuit board may include a first circuit board portion and/or a second circuit board portion. The connector may be configured to connect the first circuit board portion and/or the second circuit board portion to the housing. The first portion may be connected to the housing; the second portion may be connected to the first portion of the circuit board, and/or the third portion may be connected to the second portion of the circuit board. The first portion may include a first engagement portion, the second portion may include a second engagement portion, and/or the third portion may include a third engagement portion. The first engagement portion, the second engagement portion, and/or the third engagement portion may be disposed substantially perpendicular to each other.

With embodiments, the first engagement portion, the second engagement portion, and/or the third engagement portion may include substantially the same configuration. The first portion may include a first protrusion, and/or a first engagement portion. The second portion may include a second protrusion and/or a second engagement portion. The third portion may include a third protrusion and/or a third engagement portion. The first engagement portion, the second engagement portion, and/or the third engagement portion may each include a tab. The circuit board may be disposed partially between the tab of the second engagement portion and the second protrusion. The circuit board may be disposed partially between the tab of the third engagement portion and the third protrusion. The housing may include a guiding formation. The connector may be configured to retain at least a portion of the first circuit board portion in a first portion of the guiding formation; the connector may be configured to retain at least a portion of the second circuit board portion in the second portion of the guiding formation; and/or the first portion of the guiding formation may be substantially perpendicular to the second portion of the guiding formation.

In embodiments, a connector may include a body, a first portion, a second portion, and/or a third portion. The first portion, the second portion, and/or the third portion may extend from the body and/or are substantially perpendicular to each other. The first portion may be configured to selectively connect to a first surface in a Z-direction. The second portion may be configured to selectively connect to a second surface in a Y-direction. The third portion may be configured to connect to a third surface in an X-direction. The first surface may be a portion of a housing; the second surface may be a first portion of a circuit board; and/or the third surface may be a second portion of the circuit board. The first portion may include a first protrusion and/or a first engagement portion. The second portion may include a second protrusion and/or a second engagement portion. The third portion may include a third protrusion and/or a third engagement portion. The first engagement portion, the second engagement portion, and/or the third engagement portion may each include a tab.

With embodiments, the first protrusion may be configured to contact a first side of the first surface. The tab of the first engagement portion may be configured to contact a second side of the first surface. The second protrusion may be configured to contact a first side of the second surface. The tab of the second engagement portion may be configured to contact a second side of the second surface. The third protrusion may be configured to contact a first side of the third surface and/or the tab of the third engagement portion may be configured to contact a second side of the third surface. The first engagement portion, the second engagement portion, and/or the third engagement portion may be configured to be inserted through apertures in the first surface, the second surface, and/or the third surface, respectively. The first protrusion, the second protrusion, and/or the third protrusion may be configured to be inserted through the apertures in the first surface, the second surface, and/or the third surface, respectively. Each of the first protrusion, the second protrusion, and/or the third protrusion include a first tab and/or a second tab that may be configured to selectively engage the first surface, the second surface, and/or the third surface.

In embodiments, a method of connecting a connector may include providing a circuit board, a housing, and/or a connector. The method may include connecting the connector to the circuit board; inserting the connector and/or the circuit board into the housing; and/or connecting the connector to the housing. The connector may include a first portion, a second portion, and/or a third portion. Connecting the connector to the circuit board may include connecting the first portion to a first surface of the circuit board and/or connecting the second portion to a second surface of the circuit board. The first portion, the second portion, and/or the third portion may be substantially perpendicular to each other. The second portion and/or the third portion may extend substantially in a common plane. Inserting the circuit board and/or the connector includes inserting the circuit board and/or the connector into the housing substantially simultaneously and/or in substantially the same direction. The conductor may include three engagement portion that may include substantially the same configuration.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they are not intended to limit the present disclosure to these embodiments and/or examples. On the contrary, the present disclosure is intended to cover alternatives, modifications, and equivalents.

Figure 1:
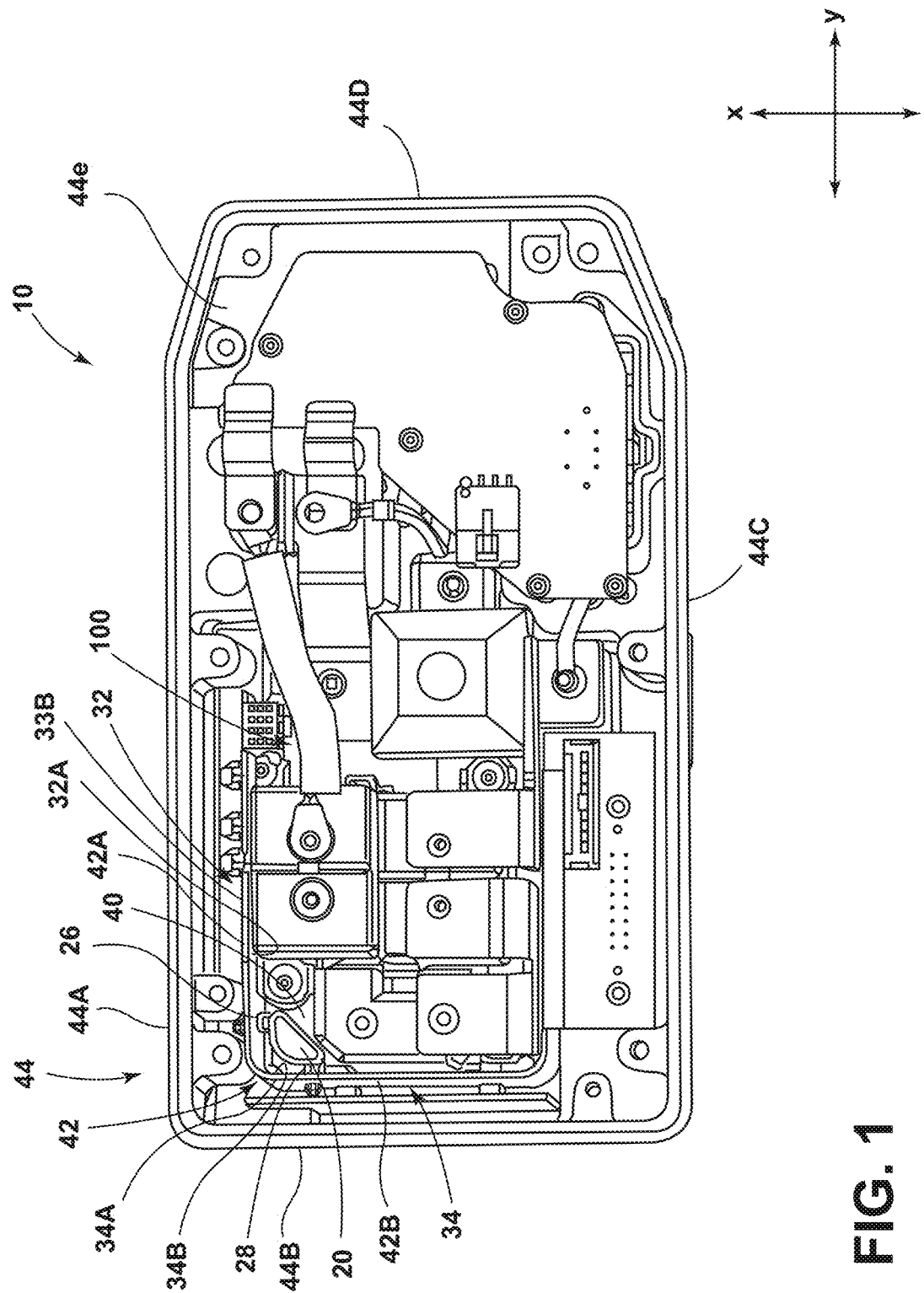
FIG. 1 is a top view generally illustrating an embodiment of a connector and a junction box according to teachings of the present disclosure.
Figure 1A:
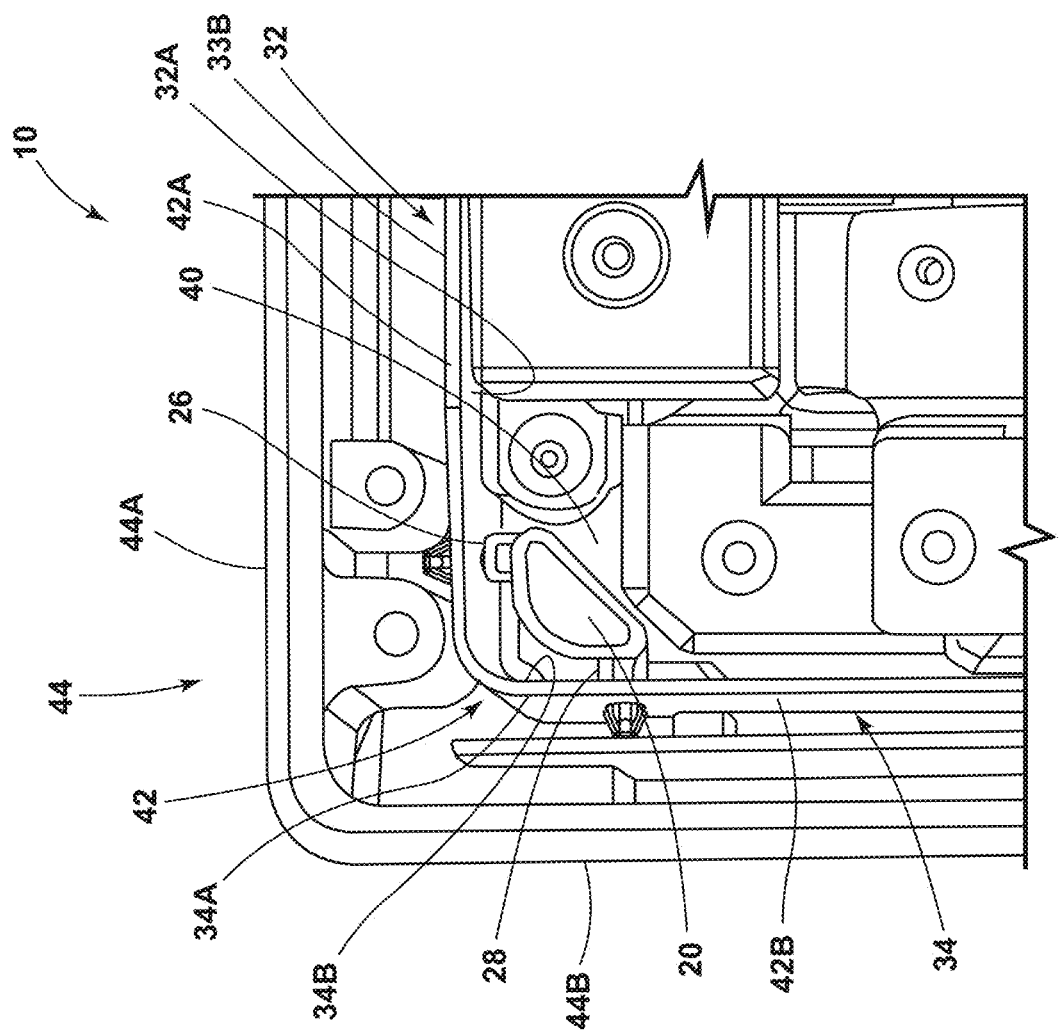
FIG. 1A is a top view generally illustrating portions of an embodiment of a connector and a junction box according to teachings of the present disclosure.
Figure 2A:
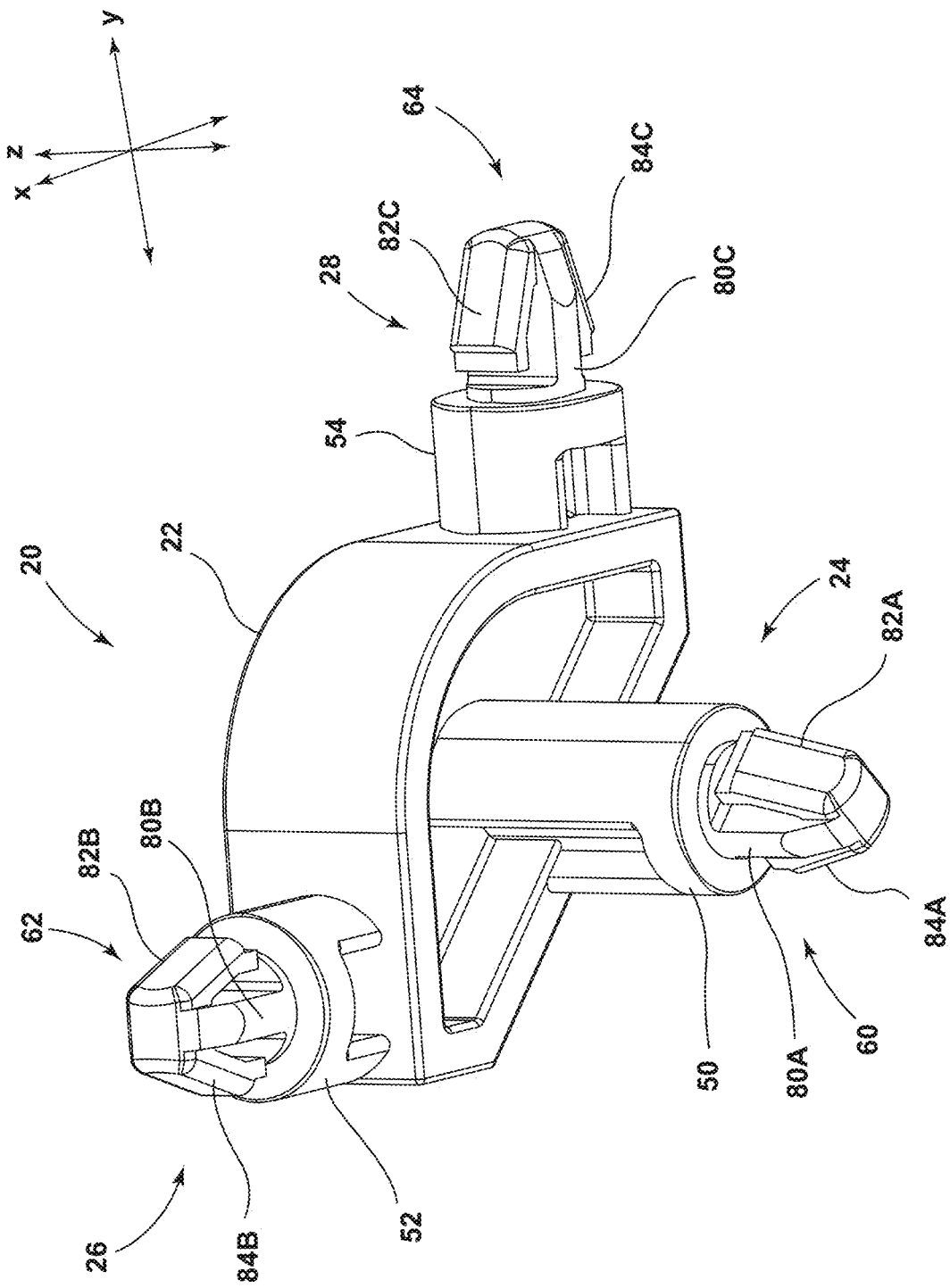
FIG. 2A is a perspective view generally illustrating an embodiment of a connector according to teachings of the present disclosure.
Figure 2B:
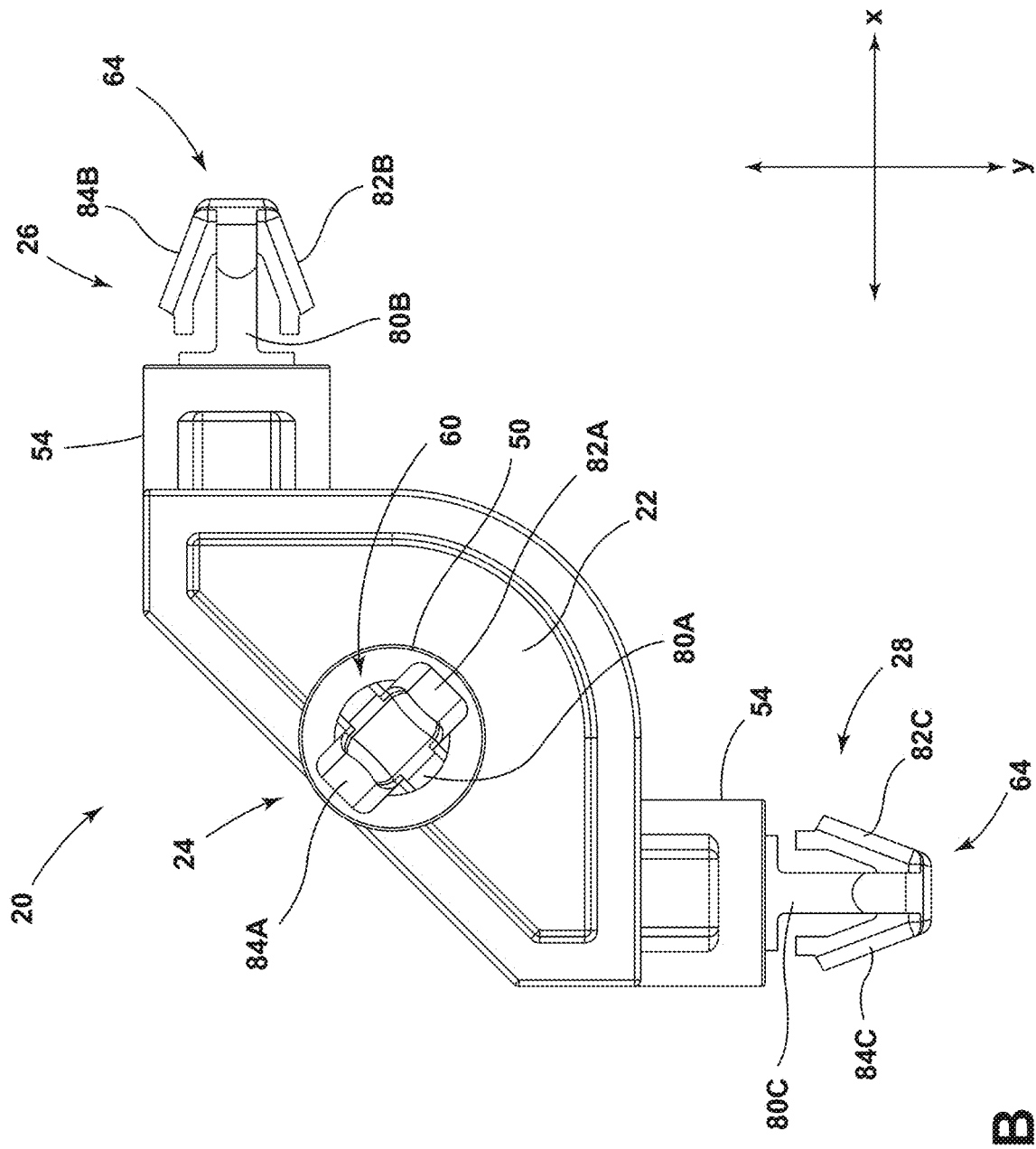
FIG. 2B is a bottom view generally illustrating an embodiment of a connector according to teachings of the present disclosure.
Figure 2C:
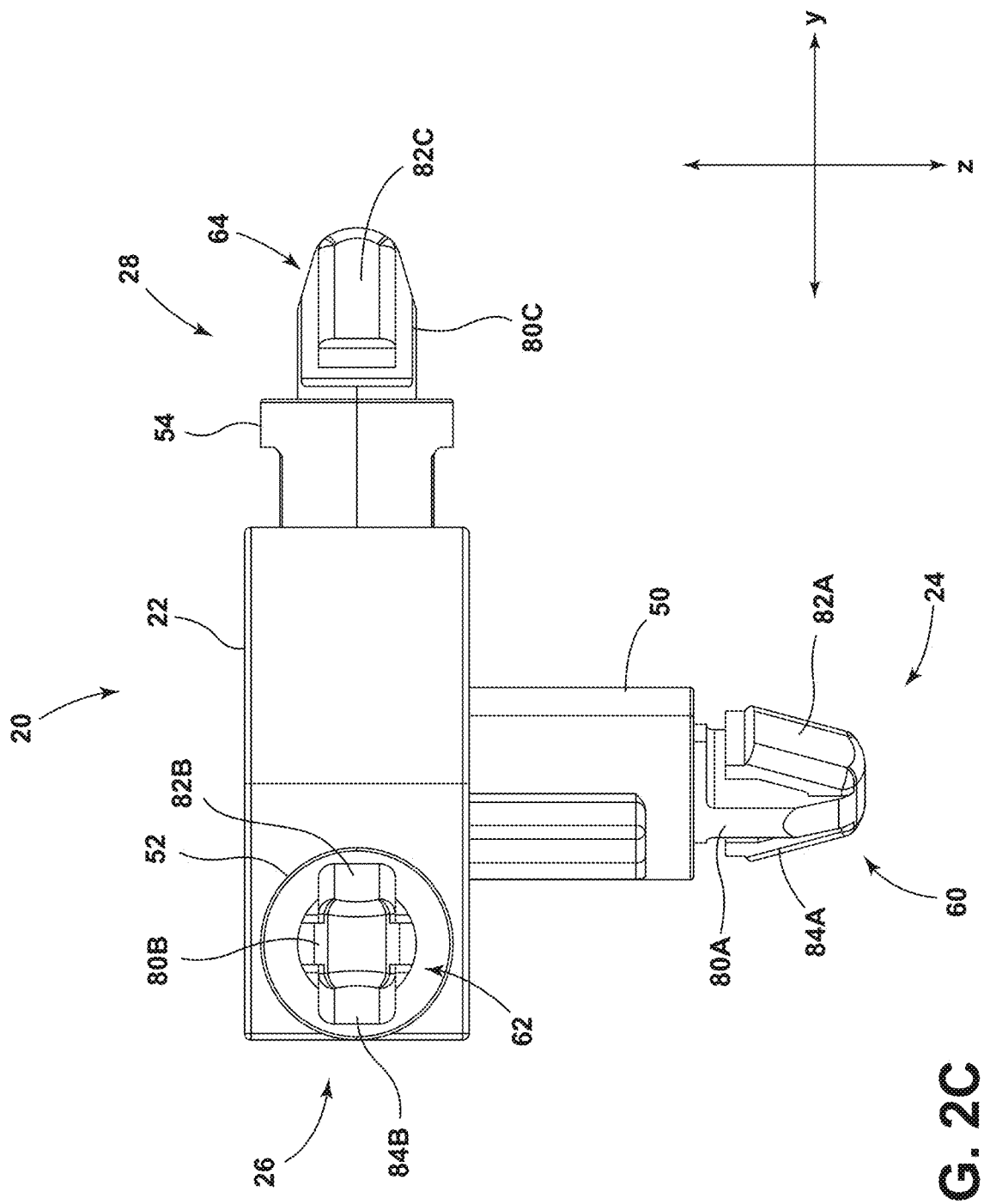
FIG. 2C is a side view generally illustrating an embodiment of a connector according to teachings of the present disclosure.
Figure 2D:
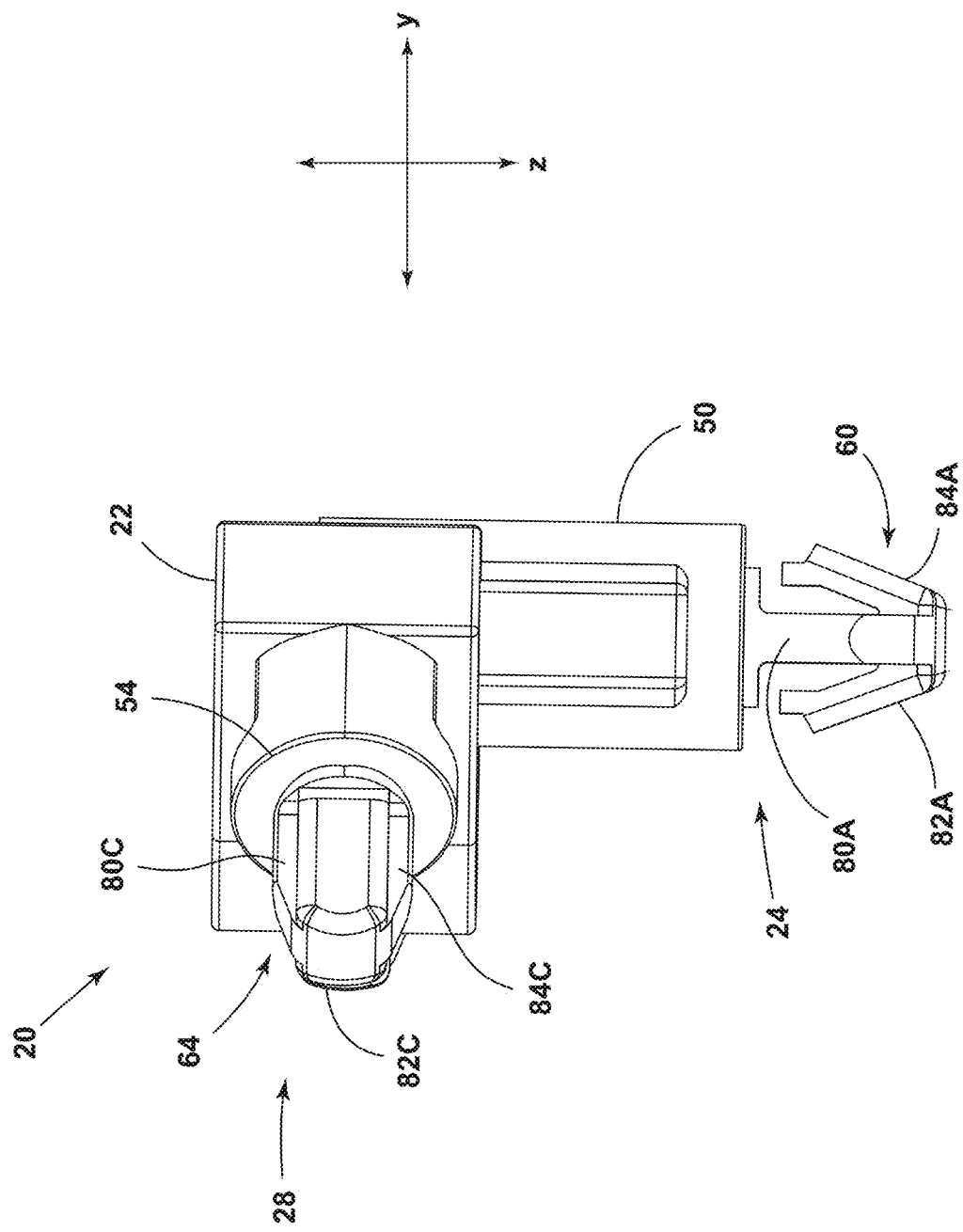
FIG. 2D is a side view generally illustrating an embodiment of a connector according to teachings of the present disclosure.

In embodiments, such as generally illustrated in FIGS. 1 and 1A, an electrical assembly 10 may include a connector 20, a housing 40, a casing 44, and/or a circuit board 42. With embodiments, such as generally illustrated in FIGS. 2A, 2B, 2C, and 2D, a connector 20 may include a body 22, a first portion 24, a second portion 26, and/or a third portion 28. The connector 20 may be configured to connect to a first surface 30 (see, e.g., FIG. 3), a second surface 32, and/or a third surface 34. For example and without limitation, the first portion 24 may connect to the first surface 30, the second portion 26 may connect to the second surface 32, and/or the third portion 28 may connect to the third surface 34. The housing 40 may include the first surface 30. The circuit board 42 may include the second surface 32 and/or the third surface 34. The connector 20 may be configured to limit movement of the circuit board 42 in at least one direction relative to the housing 40. The connector 20 may be disposed substantially in a casing 44 (e.g., a junction box and/or an electronic module). The connector 20 may be substantially disposed near a corner of the casing 44 and/or the connector 20 may be configured to retain or hold a circuit board 42 that may be disposed in the casing 44.

Figure 3:
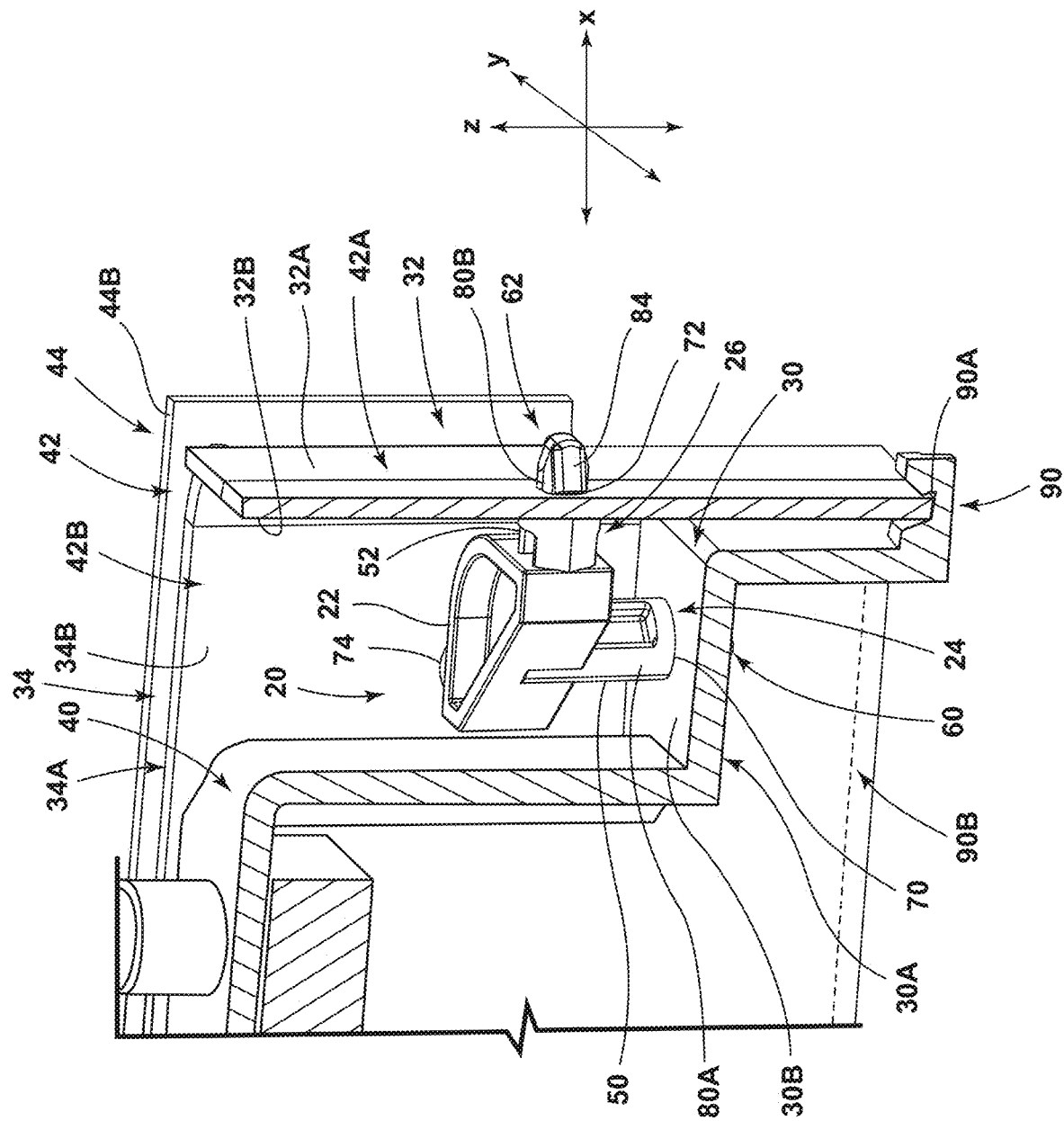
FIG. 3 is a sectional view generally illustrating an embodiment of a connector and a junction box according to teachings of the present disclosure.
Figure 4A:
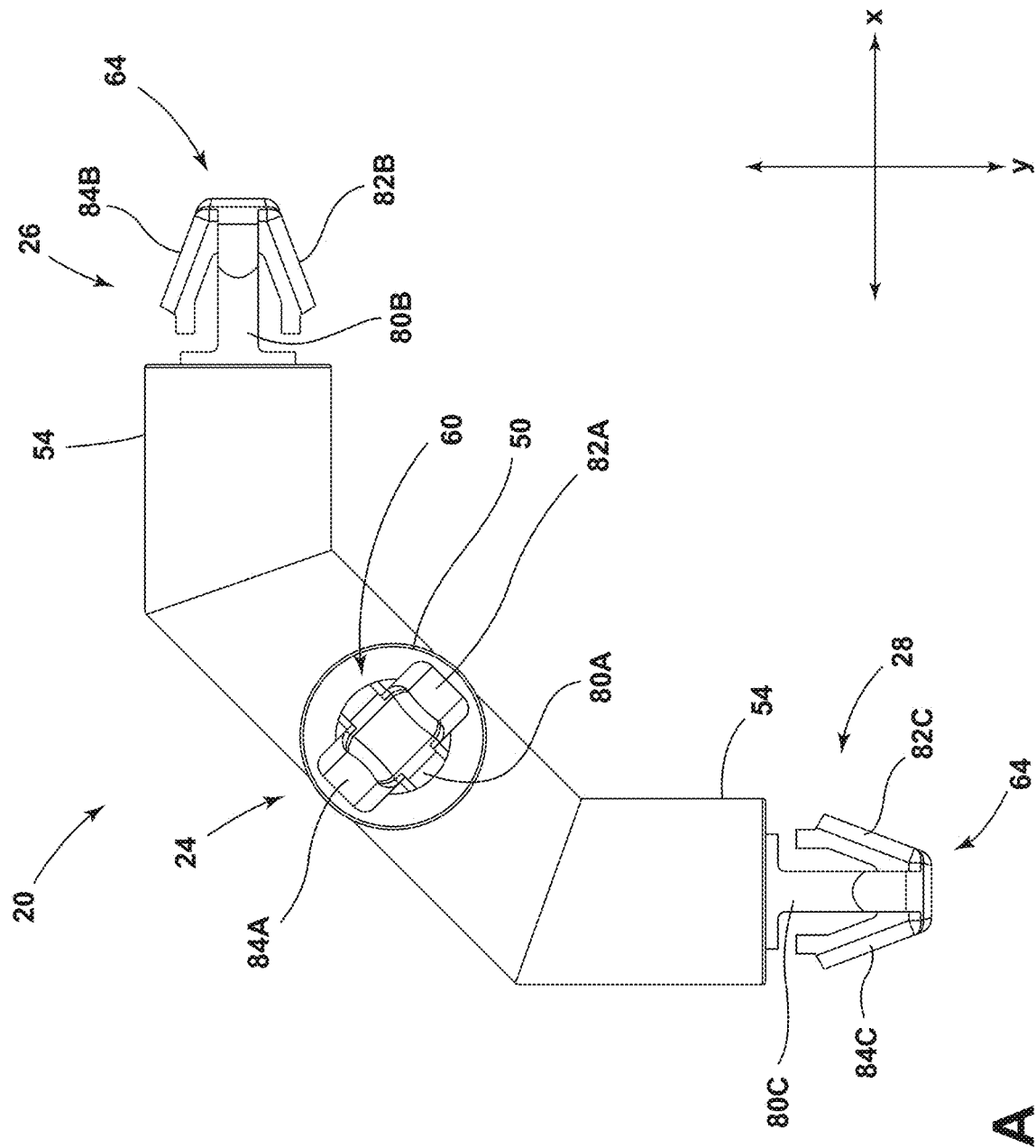
FIG. 4A is a bottom view generally illustrating an embodiment of a connector according to teachings of the present disclosure.
Figure 4B:
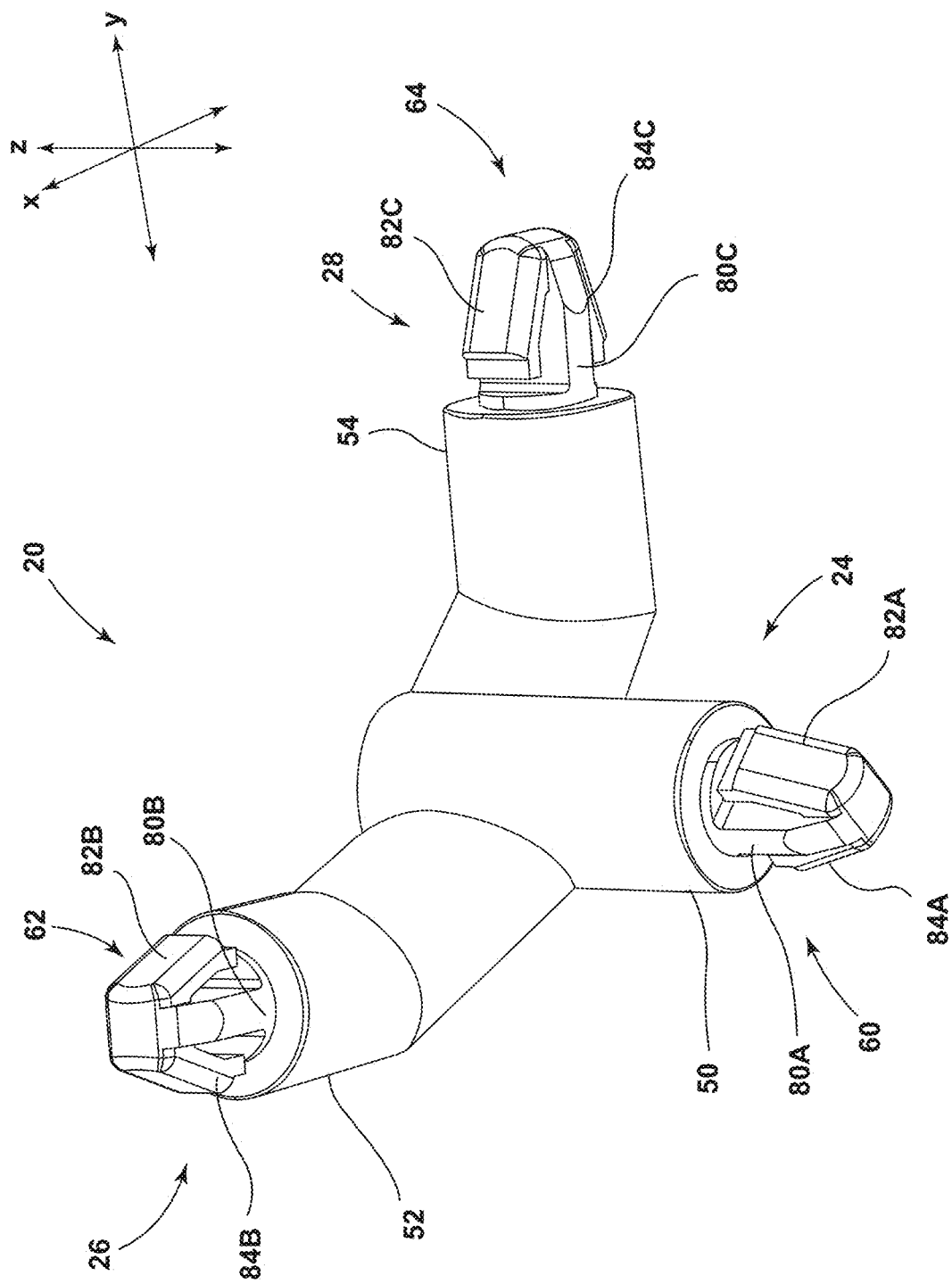
FIG. 4B is a perspective view generally illustrating an embodiment of a connector according to teachings of the present disclosure.
Figure 5:
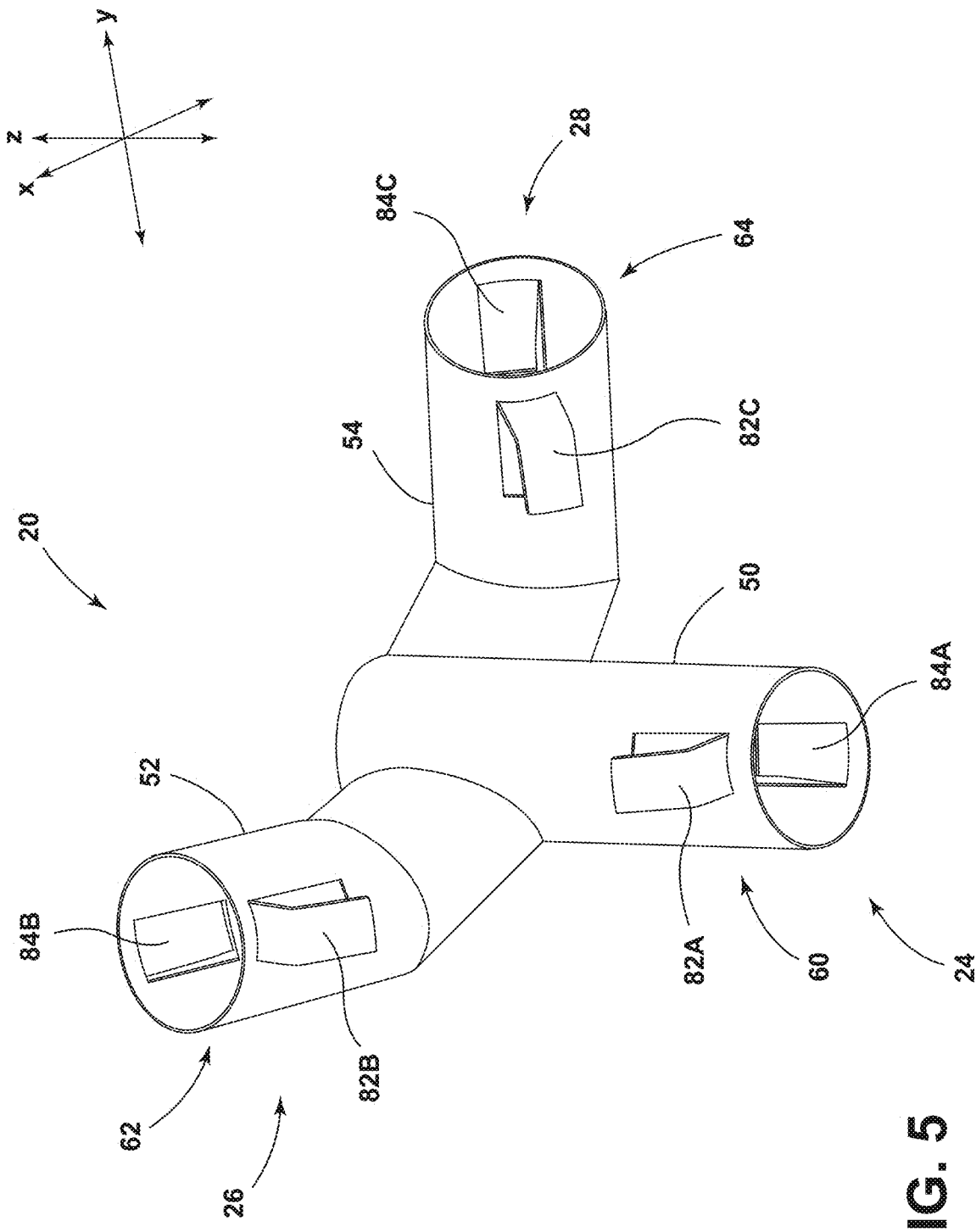
FIG. 5 is a perspective view generally illustrating an embodiment of a connector according to teachings of the present disclosure.
Figure 6:
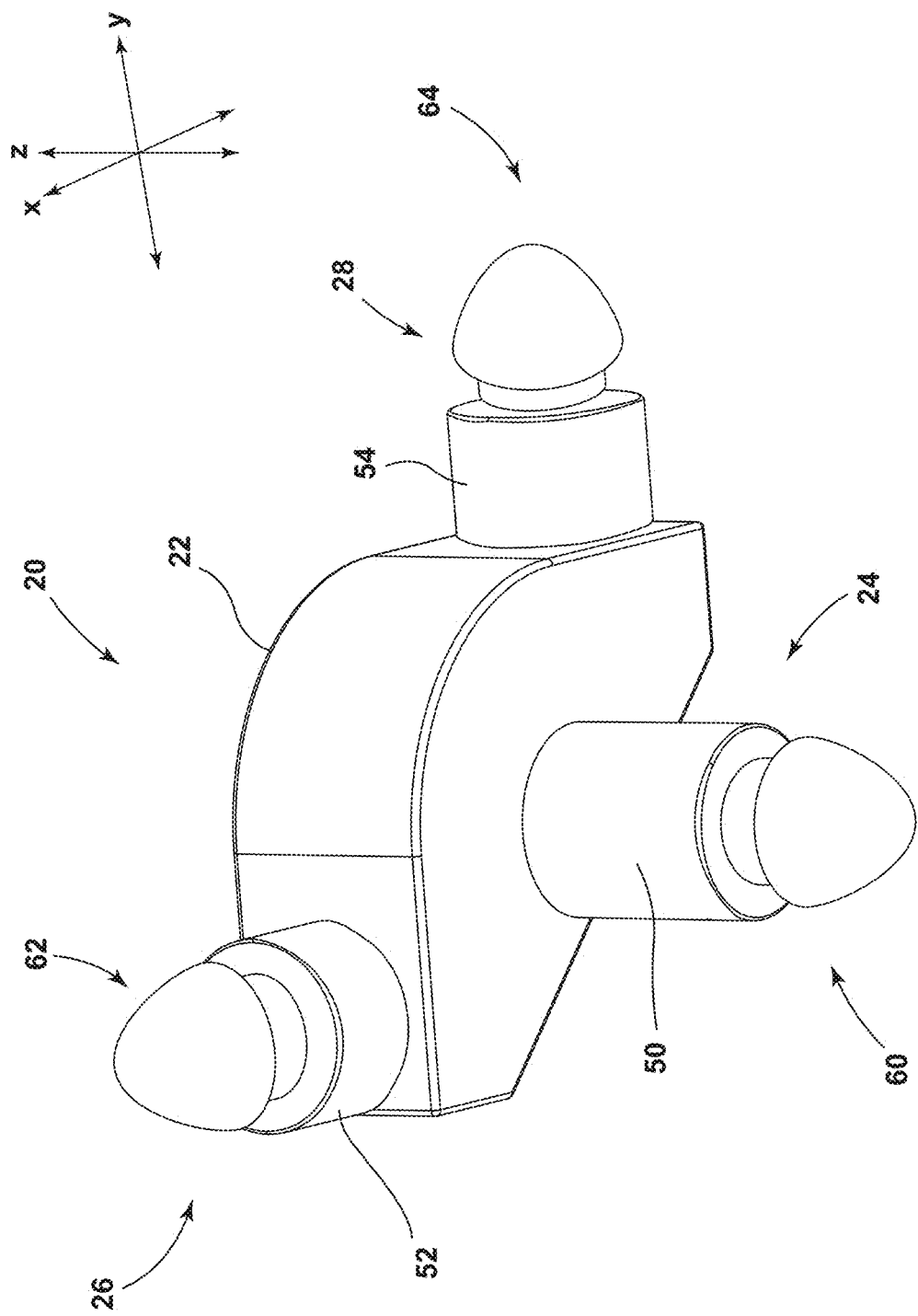
FIG. 6 is a perspective view generally illustrating an embodiment of a connector according to teachings of the present disclosure.

With embodiments, the connector 20 may be connected to a portion of the housing 40 (e.g., the first surface 30) substantially adjacent and/or proximate a side wall of the casing 44 (see, e.g., FIGS. 1, 1A, and 3). The casing 44 may include a first side wall 44A, a second side wall 44B, a third side wall 44C, a fourth side wall 44D, and/or a base wall 44E (e.g., a horizontal wall) from which the side walls 44A, 44B, 44C, 44D may extend (e.g., perpendicularly). A first portion 42A and/or a second portion 42B of the circuit board 42 (e.g., the second surface 32 and/or the third surface 34) may be disposed substantially vertically in the casing 44 and/or may be proximate at least two of the first side wall 44A, the second side wall 44B, the third side wall 44C, and/or the fourth side wall 44D. The connector 20 may be configured to retain the second surface 32 and/or the third surface 34 (e.g., the circuit board 42) relative to the housing 40 and/or the casing 44. The connector 20 may limit movement in at least one direction of the second surface 32 and/or the third surface 34 from the first side wall 44A and/or the second side wall 44B. The first portion 42A and the second portion 42B of the circuit board 42 may be integrally formed with each other (e.g., the circuit board 42 may be bent) or the first portion 42A and the second portion 42B may be separate components.

With embodiments, such as generally illustrated in FIGS. 2A, 2B, 2C, 2D, 4A, 4B, 5, and 6, the connector 20 may include a body 22, a first portion 24, a second portion 26, and/or a third portion 28. The connector 20 may be formed as a monolithic component (e.g., the connector 20 may be formed as a single piece and/or from a single material). The first portion 24, the second portion 26, and/or the third portion 28 may extend substantially (e.g., in different directions) from the body 22. The body 22 may include one or more of a variety of shapes, sizes, and/or configurations. For example and without limitation, the body 22 may be substantially triangular shaped and/or rounded. The first portion 24 may extend from the body 22 substantially in the Z-direction. The second portion 26 may extend from the body 22 substantially in the X-direction. The third portion 28 may extend from the body 22 substantially in the Y-direction. The first portion 24, the second portion 26, and/or the third portion 28 may extend substantially perpendicular to each other.

In embodiments, the first portion 24, the second portion 26, and/or the third portion 28 may be configured to limit relative movement of housing 40 and the circuit board 42, such as via three connections. The first portion 24 of the connector 20 may be selectively connectable to the first surface 30 (e.g., the housing 40). The second portion 32 of the connector 20 may be selectively connectable to a first portion 42A of the circuit board 42 (e.g., the second surface 32). The third portion 28 of the connector 20 may be selectively connectable to a second portion 42B of the circuit board 42 (e.g., the third surface 34). The first portion 24 of the connector 20 may be configured to substantially limit movement of the circuit board 42 via a connection with the housing 40 in the Z-direction. The second portion 26 of the connector 20 may be configured to substantially limit movement of the circuit board 42 via a connection to the circuit board 42 in the X-direction. The third portion 28 of the connector 20 may be configured to substantially limit movement of the circuit board 42 via a connection to the circuit board 42 in the Y-direction. To at least some degree, some or each of the first portion 24, the second portion 26, and/or the third portion 28 may limit movement of the circuit board 42 in three directions (the X-direction, the Y-direction, and/or the Z-direction).

With embodiments, such as generally illustrated in FIGS. 2A, 2B, 2C, 2D, 4A, 4B, 5, and 6, the first portion 24, the second portion 26, and/or the third portion 28 of the connector 20 may each include a protrusion 50, 52, 54 and/or an engagement portion 60, 62, 64. The first portion 24 of the connector 20 may include a first protrusion 50 and/or a first engagement portion 60. The second portion 26 of the connector 20 may include a second protrusion 52 and/or a second engagement portion 62. The third portion 28 of the connector 20 may include a third protrusion 54 and/or a third engagement portion 64. The protrusions 50, 52, 54 may include one or more of a variety of shapes, sizes, and/or configurations. For example and without limitation, the protrusions 50, 52, 54 may be substantially cylindrical and/or rectangular shaped. The protrusions 50, 52, 54 and/or the engagement portions 60, 62, 64 may include a metal material (e.g., may include one or more stamped metal plates such as in FIG. 5), a rubber material (see, e.g., FIG. 6), and/or a plastic material, such as a polymer (see, e.g., FIGS. 2A-4B). The protrusions 50, 52, 54 may extend outward from the body 22 of the connector 20. The protrusions 50, 52, 54 may be connected and/or formed with the engagement portions 60, 62, 64. The first protrusion 50 may be configured to space the body 22 a distance from the first surface 30 (e.g., the housing 40), such as to align the body 22 at or about a middle portion of the circuit board 42. The second protrusion 52 and/or the third protrusion 54 may be configured to space the second surface 32 and/or the third surface 34 (e.g., the first portion 42A and/or the second portion 42B of the circuit board 42) a distance from the body 22 of the connector 20. The length of the second protrusion 52 and/or the third protrusion 54 may correspond to a distance of separation from the body 22 of the connector 20. For example and without limitation, the length of the second protrusion 52 may correspond to the distance between the first portion 42A of the circuit board 42 and the body 22 of the connector 20. The length of the third protrusion 54 may correspond to the distance between the second portion 42B of the circuit board 42 and the body 22 of the connector 20.

In embodiments, such as generally illustrated in FIGS. 2A, 2B, 2C, 2D, 4A, 4B, 5, and 6, the connector 20 may include a first engagement portion 60, a second engagement portion 62, and/or a third engagement portion 64. The first engagement portion 60 may be connected to the first protrusion 50, the second engagement portion 62 may be connected to the second protrusion 52, and/or the third engagement portion 64 may be connected to the third protrusion 54. The first engagement portion 60, the second engagement portion 62, and/or the third engagement portion 64 may be configured to be at least partially received by the first surface 30, the second surface 32, and/or the third surface 34 (e.g., the circuit board 42 and/or the housing 40). For example and without limitation, the first engagement portion 60 may be at least partially received by the first surface 30. The first surface 30 (e.g., the housing 40) may include a first aperture 70 that may at least partially receive the first engagement portion 60 (see, e.g., FIG. 3). The first aperture 70 may include one or more of a variety of shapes, sizes, and/or configurations. The first aperture 70 may be substantially circular and/or rectangular. The shape and/or size of the first aperture 70 and the first engagement portion 60 may be substantially similar such that the first engagement portion 60 may engage the first aperture 70 (e.g., with minimal play between the first aperture 70 and the first engagement portion 60). The engagement portions 60, 62, 64 may, for example and without limitation, include substantially the same configuration (e.g., shape, size, material, etc.).

With embodiments, the second engagement portion 62 may be at least partially received by the second surface 32 (e.g., first portion 42A of the circuit board 42), and/or the third engagement portion 64 may be at least partially received by the third surface 34 (e.g., the second portion 42B of the circuit board 42). The first portion 42A of the circuit board 42 may include a second aperture 72, and/or the second portion 42B of the circuit board 42 may include a third aperture 74. The second engagement portion 62 may be at least partially received by the second aperture 72, and/or the third engagement portion 64 may be at least partially received by the third aperture 74. The second aperture 72 and/or the third aperture 74 may include one or more of a variety of shapes, sizes, and/or configurations. For example and without limitation, the second aperture 72 and/or the third aperture 74 may be substantially circular and/or rectangular. The shape and/or size of the apertures 72, 74 and the engagement portions 62, 64 may be substantially similar such that the engagement portions 62, 64 may engage the apertures 72, 74 with minimal play between the apertures 72, 74 and the engagement portions 62, 64.

In embodiments, such as generally illustrated in FIGS. 2A, 2B, 2C, 2D, 4A, 4B, 5, and 6, the first engagement portion 60, the second engagement portion 62, and/or the third engagement portion 64 may each include a base portion 80A, 80B, 80C, a first tab 82A, 82B, 82C, and/or a second tab 84A, 84B, 84C. The first tabs 82A, 82B, 82C and/or the second tabs 84A, 84B, 84C may be configured to connect the connector 20 to the first surface 30, the second surface 32, and/or the third surface 34 (e.g., the circuit board 42 and/or the housing 40). For example and without limitation, each engagement portions 60, 62, 64 may each include only one tab 82A 82B, 82C. The first tabs 82A, 82B, 82C and/or the second tabs 84A, 84B, 84C may include one or more of a variety of shapes, sizes, and/or configurations. For example and without limitation, the first tabs 82A, 82B, 82C and/or the second tabs 84A, 84B, 84C may be substantially rectangular, triangular, and/or rounded. The first tabs 82A, 82B, 82C and/or the second tabs 84A, 84B, 84C may project from the base portions 80A, 80B, 80C at an angle (e.g., an acute angle with respect to the base portion). The base portions 80A, 80B, 80C may extend from an end of the respective protrusions 50, 52, 54 (see, e.g., FIGS. 2A, 2B, 2C, and 2D). For example and without limitation, a first base portion 80A may extend (e.g., substantially coaxially) from the first protrusion 50 (e.g., from a center of the first protrusion 50). The second base portion 80B may extend (e.g., substantially coaxially) from the second protrusion 52 (e.g., from a center of the second protrusion 52). The third base portion 80C may extend (e.g., substantially coaxially) from the third protrusion 54 (e.g., from a center of the third protrusion 54). A cross-sectional shape of the first tabs 82A, 82B, 82C and/or the second tabs 84A, 84B, 84C may, for example and without limitation, be substantially rectangular.

With embodiments, such as generally illustrated in FIGS. 2A, 2B, 2C, 2D, 4A, 4B, 5, and 6, the first tabs 82 may be disposed on a first side of the base portions 80A, 80B, 80C, and/or the second tabs 84A, 84B, 84C may be disposed on a second side of the base portions 80A, 80B, 80C. The first side of the base portions 80A, 80B, 80C may be opposite the second side of the base portion 80A, 80B, 80C. When connecting the engagement portions 60, 62, 64 to the first surface 30, the second surface 32, and/or the third surface 34 (e.g., the circuit board 42 and/or housing 40), the first tabs 82A, 82B, 82C and/or the second tabs 84A, 84B, 84C may be inserted into the apertures 70, 72, 74. The first tabs 82A, 82B, 82C and/or the second tabs 84A, 84B, 84C may deflect inward (e.g., towards a center of the respective base portions 80A, 80B, 80C) when the outer side of the tabs 82A, 82B, 82C, 84A, 84B, 84C contact the edge of the apertures 70, 72, 74. The first tabs 82A, 82B, 82C and/or the second tabs 84A, 84B, 84C may contact the respective base portions 80A, 80B, 80C as the engagement portions 60, 62, 64 may move through the apertures 70, 72, 74. The engagement portions 60, 62, 64 may be successfully/completely connected with the first surface 30, the second surface 32, and/or the third surface 34 (e.g., the circuit board 42 and/or the housing 40) when the first tabs and the second tabs are disposed on the opposite side of the surfaces than the respective protrusions 50, 52, 54. The first tabs 82A, 82B, 82C and/or the second tabs 84A, 84B, 84C may deflect outward (e.g., the first tabs 82A, 82B, 82C and/or the second tabs 84A, 84B, 84C may return a normal/rest position) once the respective engagement portion 60, 62, 64 is sufficiently connected to the first surface 30, the second surface 32, and/or the third surface 34. For example and without limitation, the first tabs 82A, 82B, 82C and/or the second tabs 84A, 84B, 84C may contact the first surface 30, the second surface 32, and/or the third surface 34, respectively when completely connected.

In embodiments, such as generally illustrated in FIG. 3, in a connected position, the first tabs 82A, 82B, 82C and/or the second tabs 84A, 84B, 84C may contact a first side 30A, 32A, 34A (e.g., outer sides) of the surfaces 30, 32, and/or ends of the protrusions 50, 52, 54 may contact the second sides 30B, 32B, 34B (e.g., inner sides) of the surfaces 30, 32, 34. The ends of the protrusions 50, 52, 54 may include a dimension (e.g., a diameter) larger than a dimension of the apertures 70, 72, 74 such that the protrusions 50, 52, 54 may not be disposed in the apertures 70, 72, 74. For example and without limitation, a portion of the housing 40 may be disposed between the protrusion 50 and the tabs 82A, 84A, a portion of the first portion 42A of the circuit board 42 may be disposed between the protrusion 52 and the tabs 82B, 84B, and/or a portion of the second portion 42B of the circuit board 42 may be disposed between the protrusion 54 and the tabs 82C, 84C. A distance between the protrusion 52 and the tabs 82B, 84B, and/or a distance between the protrusion 54 and the tabs 82C, 84C may correspond to the thickness of the circuit board 42. The first tabs 82A, 82B, 82C, the second tabs 84A, 84B, 84C, and/or the end of the protrusions 50, 52, 54 may limit movement of the second surface 32 and/or third surface 34 (e.g., the first portion 42A and/or the second portion 42B of the circuit board 42) in at least one direction.

With embodiments, such as generally illustrated in FIG. 3, the connector 20 may be connected to a circuit board 42 (e.g., the second surface 32 and/or the third surface 34) that may be disposed substantially in the vertical direction (Z-direction). The housing 40 and/or the casing 44 may include a guiding formation 90 (which may include, but is not be limited to, a channel) that may be configured to receive at least a portion of the second surface 32 and/or the third surface 34. The guiding formation 90 may be disposed on a bottom of the housing 40. The guiding formation 90 may extend substantially in the X-direction and/or Y-direction. The guiding formation 90 may receive a bottom portion of the second surface 32 and/or the third surface 34 (e.g., the first portion 42A and/or the second portion 42B of the circuit board 42). The guiding formation 90 may be configured to guide and/or assist in assembling the connector 20, the circuit board 42 (the second surface 32 and/or the third surface 34), and/or the housing 40 (the first surface 30). The guiding formation 90 may limit movement of the circuit board 42 in at least one direction. In embodiments, the guiding formation 90 may have a first portion 90A and/or a second portion 90B. The first portion 90A of the guiding formation 90 may extend substantially in the Y-direction, and/or the second portion 90B of the guiding formation 90 may extend substantially in the X-direction. The first portion 90A of the guiding formation 90 may limit movement of the circuit board 42 in the X-direction, and/or the second portion 90B of the guiding formation 90 may limit movement of the circuit board 42 in the Y-direction. The first portion 90A may be aligned substantially in the Y-direction, and/or the second portion 90B may be aligned substantially in the X-direction. The first portion 90A of the guiding formation 90 may be configured to receive at least a portion of the first portion 42A of the circuit board 42. The second portion 90B of the guiding formation 90 may be configured to receive at least a portion of the second portion 42B of the circuit board 42.

In embodiments, a method of connecting a connector 20 may include providing a connector 20, a circuit board 42 including a first portion 42A and/or a second portion 42B, and/or an electrical casing 44 having a housing 40 (e.g., a fuse housing). A method of connecting a connector 20 may include connecting the connector 20 to the first portion 42A and/or the second portion 42B of the circuit board 42. The method may include inserting the connector 20 and/or the circuit board 42 into the electrical casing 44, and/or connecting the connector 20 to the housing 40. The connector 20 and the circuit board 42 may be connected to the housing 40 and/or the casing 44 substantially simultaneously and/or in substantially the same direction (e.g., the Z-direction). The connector 20 may include a first portion 24, a second portion 26, and/or a third portion 28. Connecting the connector 20 to the circuit board 42 may include connecting the second portion 26 to the first portion 42A of the circuit board 42 and/or connecting the third portion 28 to the second portion 42B of the circuit board 42. Connecting the connector 20 to the housing 40 may include connecting the first portion 24 to the housing 40. Inserting the circuit board 42 and/or the connector 20 into the electrical casing 44 may include vertically inserting the circuit board 42 and the connector 20 connected to each other. Inserting the circuit board 42 into the electrical casing 44 may include inserting the first portion 42A and/or the second portion 42B of the circuit board 42 into a guiding formation 90. One or more electrical components may be connected to the housing 40 and/or the casing 44.

Figure 7A:
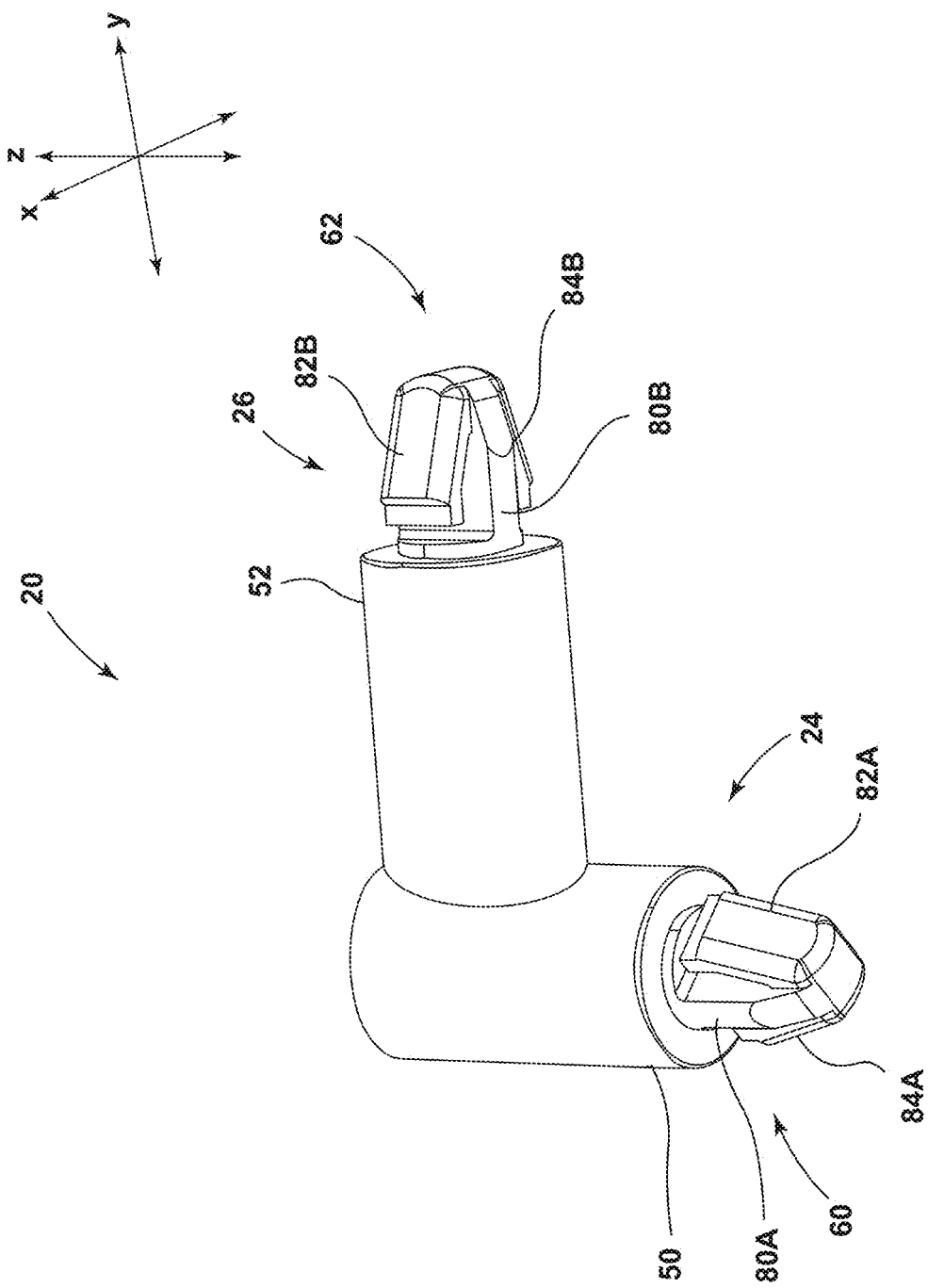
FIG. 7A is a perspective view generally illustrating an embodiment of a connector according to teachings of the present disclosure.
Figure 7B:
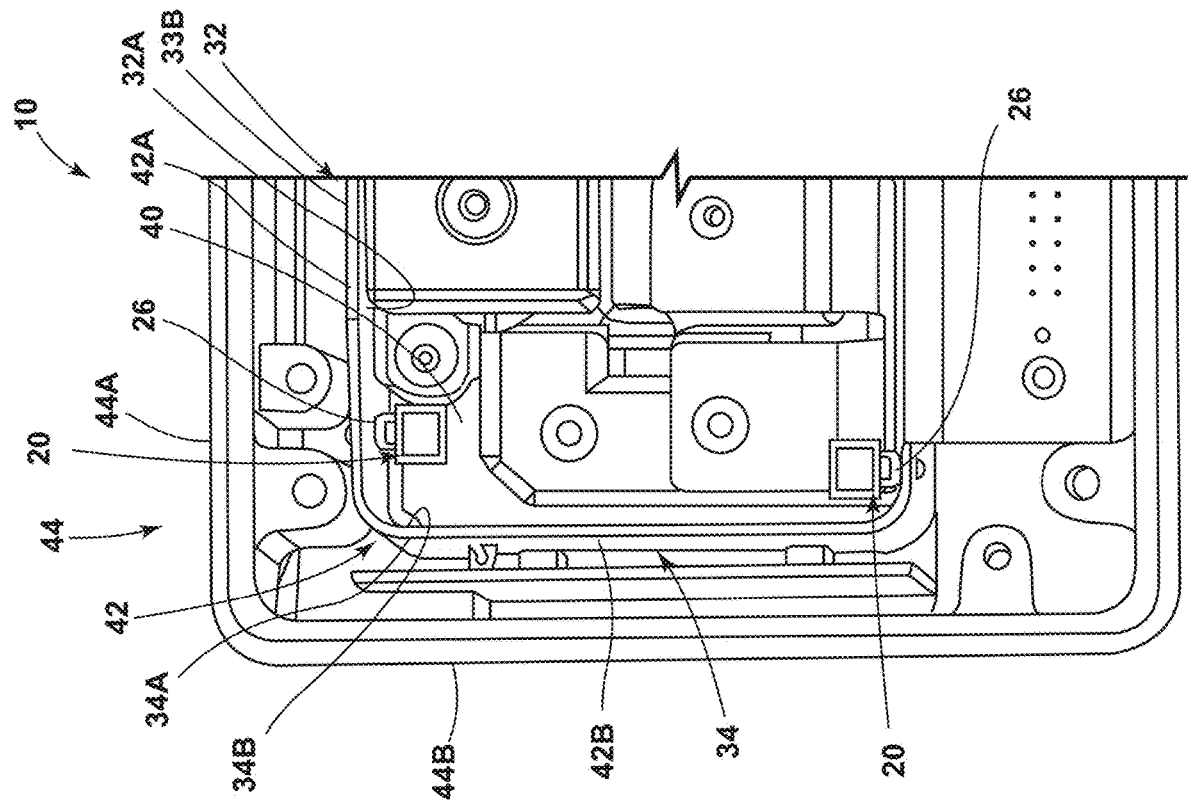
FIG. 7B is a top view generally illustrating portions of an embodiment of a connector and a junction box according to teachings of the present disclosure.

With embodiments, such as generally illustrated in FIGS. 7A and 7B, a connector 20 may include a first portion 24 and a second portion 26. The first portion 24 may extend substantially perpendicular from the second portion 26. The first portion 24 may include a first protrusion 50 and/or a first engagement portion 60. The second portion 26 may include a second protrusion 52 and/or a second engagement portion 62. The first engagement portion 60 may be connected to the first protrusion 50, and/or the second engagement portion 62 may be connected to the second protrusion 52. The first engagement portion 60 and/or the second engagement portion 62 may be at least partially received by the first surface 30, the second surface 32, and/or the third surface 34 (e.g., the circuit board 42 and/or the housing 40). For example and without limitation, the first engagement portion 60 may be at least partially received by the first surface 30. The second engagement portion 62 may be at least partially received by the second surface 32 (e.g., the first portion 42A of the circuit board 42) or the third surface 34 (e.g., the second portion 42B of the circuit board 42).

Figure 8:
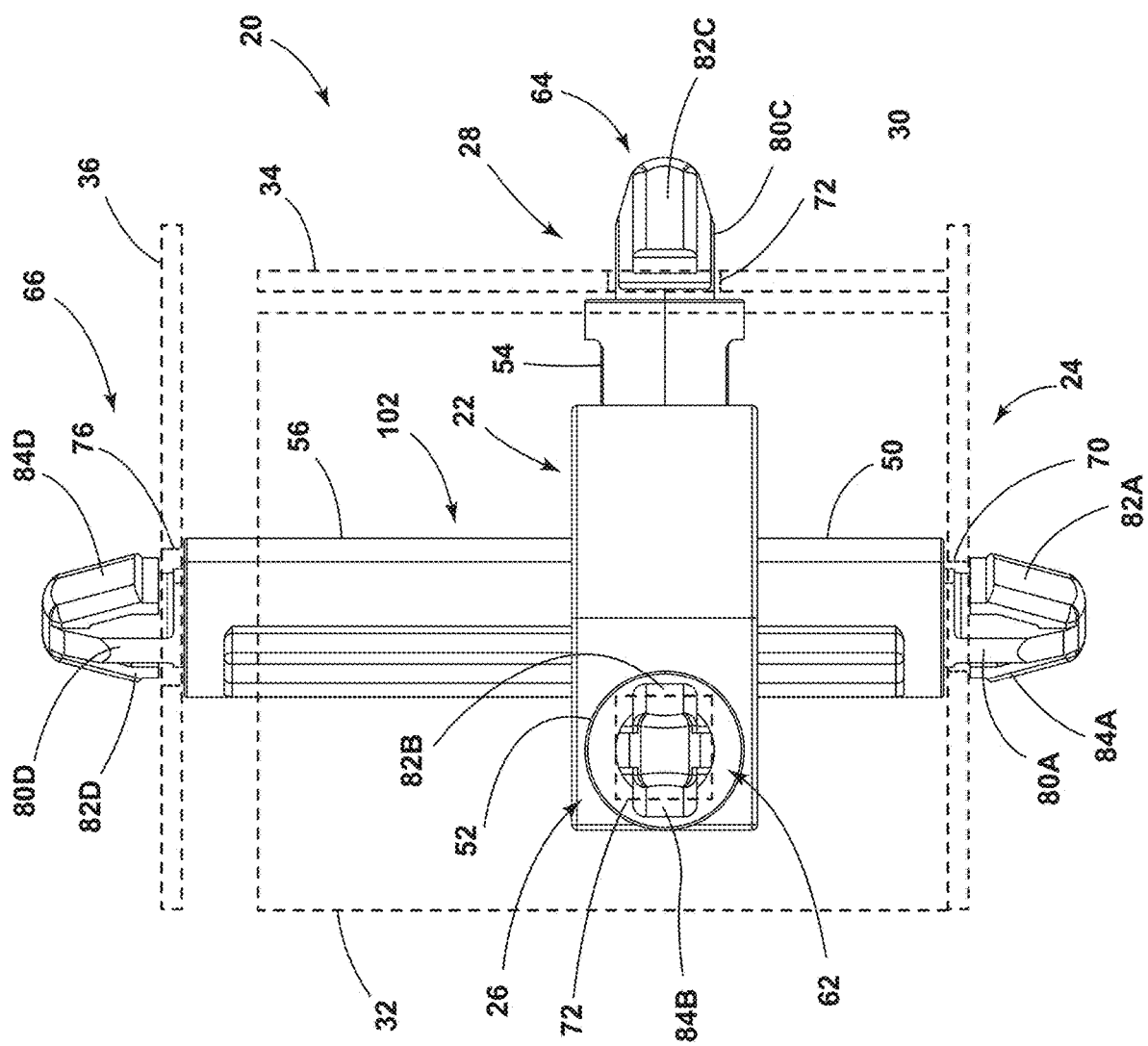
FIG. 8 is a side view generally illustrating an embodiment of a connector according to teachings of the present disclosure.

In embodiments, such as generally illustrated in FIG. 8, a connector 20 may include a first portion 24, a second portion 26, a third portion 28, and/or a fourth portion 102. The first portion 24 may extend substantially perpendicular relative to the second portion 26 and/or the third portion 28. Additionally or alternatively, the first portion 24 may extend substantially parallel and/or coaxial with the fourth portion 102, and/or the first portion 24 and the fourth portion 102 may extend in opposite directions. The first portion 24, the second portion 26, the third portion 28, and/or the fourth portion 102 of the connector 20 may each include a protrusion 50, 52, 54, 56 and/or an engagement portion 60, 62, 64, 66, respectively. The fourth portion 102 may, for example and without limitation, be configured for connection with a fourth surface 36, such as an additional circuit board and/or a cover for the housing 40. The fourth protrusion 56 may be configured to extend above, in the Z-direction, the circuit board 42. The fourth engagement portion 66 may, for example, include substantially the same or a similar configuration as engagement portions 60, 62, 64. The fourth engagement portion 66 may include a base portion 80D, a first tab 82D, and/or a second tab 84D. The fourth engagement portion 66 may be configured for insertion into a fourth aperture 76 of the fourth surface 36. The fourth portion 102 may be configured to retain the fourth surface 36, such as in a substantially perpendicular configuration relative to the second surface 32 and/or the third surface 34. Additionally or alternatively, the fourth portion 102 may be configured to retain the fourth surface 36 in a substantially parallel configuration relative to the first surface 30.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are intended to be inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

It is intended that all matter contained in the above description or shown in the accompanying drawings shall be interpreted as illustrative only and not limiting. Changes in detail or structure may be made without departing from the present disclosure.

What is claimed is:

1. A connector assembly comprising:
   a connector, including:
   a first portion;
   a second portion; and
   a third portion;
   a circuit board including a first circuit board portion and a second circuit board portion; and
   a housing;
   wherein the connector is configured to connect the first circuit board portion and the second circuit board portion to the housing; the first portion includes a first engagement portion; the second portion includes a second engagement portion; the third portion includes a third engagement portion; and the first engagement portion, the second engagement portion, and the third engagement portion are disposed substantially perpendicular to each other.

2. The assembly of claim 1, wherein the first portion is connected to the housing, the second portion is connected to the first portion of the circuit board, and the third portion is connected to the second portion of the circuit board.

3. The assembly of claim 1, wherein the first engagement portion, the second engagement portion, and the third engagement portion include substantially the same configuration.

4. The assembly of claim 1, wherein the first portion includes a first protrusion; the second portion includes a second protrusion; the third portion includes a third protrusion; the first engagement portion, the second engagement portion, and the third engagement portion each include a tab; the circuit board is disposed partially between the tab of the second engagement portion and the second protrusion; and the circuit board is disposed partially between the tab of the third engagement portion and the third protrusion.

5. The assembly of claim 1, wherein the housing includes a guiding formation; the connector is configured to retain at least a portion of the first circuit board portion in a first portion of the guiding formation; the connector is configured to retain at least a portion of the second circuit board portion in a second portion of the guiding formation; and the first portion of the guiding formation is substantially perpendicular to the second portion of the guiding formation.

6. The assembly of claim 1, wherein the first portion includes a first protrusion; the second portion includes a second protrusion; and the third portion includes a third protrusion.

7. A connector, comprising:
a body;
a first portion;
a second portion; and
a third portion;
wherein the first portion, the second portion, the third portion extend from the body and are substantially perpendicular to each other; the first portion is configured to selectively connect to a first surface in a Z-direction; the second portion is configured to selectively connect to a second surface in a Y-direction; the third portion is configured to selectively connect to a third surface in an X-direction; the first portion includes a first protrusion and a first engagement portion; the second portion includes a second protrusion and a second engagement portion; and the third portion includes a third protrusion and a third engagement portion.

8. The connector of claim 7, wherein the first surface is a portion of a housing; the second surface is a first portion of a circuit board; and the third surface is a second portion of the circuit board.

9. The connector of claim 7, wherein the first engagement portion, the second engagement portion, and the third engagement portion each include a tab.

10. The connector of claim 9, wherein the first protrusion is configured to contact a first side of the first surface; the tab of the first engagement portion is configured to contact a second side of the first surface; the second protrusion is configured to contact a first side of the second surface; the tab of the second engagement portion is configured to contact a second side of the second surface; and the third protrusion is configured to contact a first side of the third surface; and the tab of the third engagement portion is configured to contact a second side of the third surface.

11. The connector of claim 7, wherein at least a portion of the first engagement portion, the second engagement portion, and the third engagement portion are configured to be inserted through apertures in the first surface, the second surface, and the third surface, respectively; and the first protrusion, the second protrusion, and the third protrusion are configured to contact the first surface, the second surface, and the third surface, respectively.

12. The connector of claim 11, including a fourth portion configured for connection with a cover; wherein the first portion and the second portion extend in opposite directions.

13. The connector of claim 7, wherein each of the first engagement portion, the second engagement portion, and the third engagement portion include a first tab and a second tab configured to selectively engage the first surface, the second surface, and the third surface.

14. A method of connecting a connector, the method comprising:
providing a circuit board, a housing, and a connector, wherein the connector includes a first portion, a second portion, and a third portion;
connecting the connector to the circuit board, including connecting the first portion to a first surface of the circuit board and connecting the second portion to a second surface of the circuit board;
inserting the connector and the circuit board into the housing; and
connecting the connector to the housing;
wherein inserting the circuit board and the connector includes inserting the circuit board and the connector into the housing substantially simultaneously and in substantially the same direction.

15. The method of claim 14, wherein the connector includes a first engagement portion, a second engagement portion, and a third engagement portion; and the first engagement portion, the second engagement portion, and the third engagement portion are disposed substantially perpendicular to each other.

16. The method of claim 14, wherein the first portion, the second portion, and the third portion are substantially perpendicular to each other.

17. The method of claim 14, wherein the second portion and third portion extend substantially in a common plane.

18. The method of claim 14, wherein the first portion, the second portion, and the third portion each include a plurality of tabs.

19. The method of claim 14, wherein the connector includes four engagement portions that include substantially the same configuration.

* * * * *